(12) United States Patent
Liu et al.

(10) Patent No.: US 11,522,018 B2
(45) Date of Patent: Dec. 6, 2022

(54) PIXEL STRUCTURE, DISPLAY PANEL AND DISPLAY APPARATUS

(71) Applicants: Fuzhou BOE Optoelectronics Technology Co., Ltd., Fujian (CN); Beijing BOE Technology Development Co., Ltd., Beijing (CN)

(72) Inventors: Chengjun Liu, Beijing (CN); Shaojun Sun, Beijing (CN); Junxiang Lu, Beijing (CN); Xia Chen, Beijing (CN); Yanfei Chi, Beijing (CN); Junyao Yin, Beijing (CN); Xiangdong Lin, Beijing (CN); Guiguang Hu, Beijing (CN); Haiguang Li, Beijing (CN)

(73) Assignees: Fuzhou BOE Optoelectronics Technology Co., Ltd., Fujian (CN); Beijing BOE Technology Development Co., Ltd., Beijing (CN)

( * ) Notice: Subject to any disclaimer, the term of this patent is extended or adjusted under 35 U.S.C. 154(b) by 87 days.

(21) Appl. No.: 16/975,761

(22) PCT Filed: Dec. 23, 2019

(86) PCT No.: PCT/CN2019/127384
§ 371 (c)(1),
(2) Date: Aug. 26, 2020

(87) PCT Pub. No.: WO2020/140781
PCT Pub. Date: Jul. 9, 2020

(65) Prior Publication Data
US 2020/0403042 A1    Dec. 24, 2020

(30) Foreign Application Priority Data
Jan. 4, 2019   (CN) .......................... 201910009492.3

(51) Int. Cl.
*H01L 27/32*  (2006.01)
*H01L 51/00*  (2006.01)
*H01L 51/50*  (2006.01)

(52) U.S. Cl.
CPC ....... *H01L 27/3211* (2013.01); *H01L 51/0011* (2013.01); *H01L 27/3213* (2013.01); *H01L 51/5012* (2013.01)

(58) Field of Classification Search
CPC ............. H01L 27/3211; H01L 51/0011; H01L 51/5012
See application file for complete search history.

(56) References Cited

U.S. PATENT DOCUMENTS

| 9,614,191 | B2 | 4/2017 | Madigan |
| 10,269,874 | B2 | 4/2019 | Madigan |
| | | (Continued) | |

FOREIGN PATENT DOCUMENTS

| CN | 104091822 A | 10/2014 |
| CN | 106449725 A | 2/2017 |
| | (Continued) | |

OTHER PUBLICATIONS

First Office Action, including Search Report, for Chinese Patent Application No. 201910009492.3, dated May 15, 2020, 17 pages.

*Primary Examiner* — Fernando L Toledo
*Assistant Examiner* — Valerie N Newton
(74) *Attorney, Agent, or Firm* — Westman, Champlin & Koehler, P.A.

(57) ABSTRACT

The present disclosure provides a pixel structure, a display panel and a display apparatus. The pixel structure according to an embodiment of the present disclosure includes a pixel structure including: a plurality of pixel units. Each of the plurality of pixel units includes a plurality of sub-pixels, each of the plurality of sub-pixels is divided into at least two (Continued)

target sub-pixels, and a separation region is provided between two adjacent target sub-pixels.

12 Claims, 3 Drawing Sheets

(56) References Cited

U.S. PATENT DOCUMENTS

| | | |
|---|---|---|
| 10,707,273 B2 | 7/2020 | Madigan |
| 2007/0190233 A1 | 8/2007 | Chung |
| 2014/0197385 A1 | 7/2014 | Madigan |
| 2017/0236883 A1 | 8/2017 | Madigan |
| 2018/0315963 A1 | 11/2018 | Madigan |
| 2019/0156740 A1 | 5/2019 | Xu |
| 2020/0279894 A1 | 9/2020 | Madigan |
| 2020/0403042 A1 | 12/2020 | Liu et al. |

FOREIGN PATENT DOCUMENTS

| | | |
|---|---|---|
| CN | 106935632 A | 7/2017 |
| CN | 206340548 U | 7/2017 |
| CN | 107248391 A | 10/2017 |
| CN | 108550708 A | 9/2018 |
| CN | 109728061 A | 5/2019 |
| JP | 2010060802 A | 3/2010 |
| KR | 20160025327 A | 3/2016 |

PIXEL STRUCTURE, DISPLAY PANEL AND DISPLAY APPARATUS

CROSS-REFERENCE TO RELATED APPLICATION

This application is a Section 371 National Application of International Application No. PCT/CN2019/127384, filed on Dec. 23, 2019, entitled "PIXEL STRUCTURE, DISPLAY PANEL AND DISPLAY APPARATUS", which published as WO 2020/140781 A1, on Jul. 9, 2020, and claims priority to Chinese Patent Application No. 201910009492.3, filed with the National Intellectual Property Administration of China on Jan. 4, 2019, the disclosures of which are incorporated herein by reference in their entireties.

TECHNICAL FIELD

The present disclosure relates to the field of display technology, and particularly to a pixel structure, a display panel and a display apparatus.

BACKGROUND

With the continuous development of display technology, an organic light-emitting diode (OLED) display apparatus have gradually received widespread attention. When an organic light emitting material in a region of the OLED display apparatus fails, an image displayed by the OLED display apparatus will have a residual image in the region. Generally, the method of improving the residual image of the OLED display apparatus mainly lies in a user's use. For example, the user should not make the OLED display apparatus display a fixed image as far as possible, should periodically shift a virtual key to avoid the aging of the organic light emitting material at the virtual key, and should reduce the brightness of the OLED display apparatus, and the like. However, the method of improving the residual image in the related art can only delay the occurrence of the residual image in the OLED display apparatus, and also limits the user experience.

SUMMARY

In an aspect of the present disclosure, there is provided a pixel structure, including: a plurality of pixel units, wherein each of the plurality of pixel units includes a plurality of sub-pixels, each of the plurality of sub-pixels is divided into at least two target sub-pixels, and a separation region is provided between two adjacent target sub-pixels.

In an embodiment, any two target sub-pixels have a same area.

In an embodiment, a number of the target sub-pixels into which the each of the plurality of sub-pixels is divided is in a range of 2 to 10.

In an embodiment, the plurality of sub-pixels are arranged in an array, and the separation regions each have a strip shape, and are configured such that in any one row of sub-pixels, a separation region disposed in one of two adjacent sub-pixels is perpendicular to a separation region disposed in the other of the two adjacent sub-pixels, and in any one column of sub-pixels, a separation region disposed in one of two adjacent sub-pixels is also perpendicular to a separation region disposed in the other of the two adjacent sub-pixels.

In an embodiment, at least two separation regions are disposed in the each of the plurality of sub-pixels, and the at least two separation regions disposed in the each of the plurality of sub-pixels are arranged parallel to each other.

In an embodiment, the separation regions each have a strip shape, and in a case where two separation regions are disposed in the each of the plurality of sub-pixels, the separation regions are arranged such that the two separation regions disposed in the each of the plurality of sub-pixels are perpendicular to each other, and in a case where at least three separation regions are disposed in the each of the plurality of sub-pixels, the separation regions are arranged such that any two of the at least three separation regions disposed in the each of the plurality of sub-pixels are parallel or perpendicular to each other.

In an embodiment, a smallest side length of each of the at least two target sub-pixels is greater than 10 μm.

In an embodiment, the each of the plurality of sub-pixels includes an anode, a cathode, and an organic functional layer between the anode and the cathode, the organic functional layer includes an electron injection layer, an electron transport layer, a light emitting layer, a hole transport layer, and a hole injection layer, which are sequentially disposed on a side of the cathode close to the anode, wherein the light emitting layer includes a plurality of light emitting region sets, each of the plurality of light emitting region sets includes at least two light emitting regions, and the separation region is provided between two adjacent light emitting regions.

In an embodiment, the plurality of light emitting region sets are arranged in an array, and the separation regions each have a strip shape, and are arranged such that in any one row of light emitting region sets, a separation region disposed in one of two adjacent light emitting region sets is perpendicular to a separation region disposed in the other of the two adjacent light emitting region sets, and in any one column of light emitting region sets, a separation region disposed in one of two adjacent light emitting region sets is also perpendicular to a separation region disposed in the other of the two adjacent light emitting region sets.

In an embodiment, at least two separation regions are disposed in the each of the plurality of light emitting region sets, and the at least two separation regions disposed in the each of the plurality of light emitting region sets are arranged parallel to each other.

In an embodiment, the separation regions each have a strip shape, and in a case where two separation regions are disposed in the each of the plurality of light emitting region sets, the separation regions are arranged such that the two separation regions disposed in the each of the plurality of light emitting region sets are perpendicular to each other, and in a case where at least three separation regions are disposed in the each of the plurality of sub-pixels, the separation regions are arranged such that any two of the at least three separation regions disposed in the each of the plurality of light emitting region sets are parallel or perpendicular to each other.

In a further aspect of the present disclosure, there is provided a display panel including the above pixel structure.

In a further aspect of the present disclosure, there is provided a display apparatus including the above display panel.

In a further aspect of the present disclosure, there is provided a method of manufacturing a pixel structure, including steps of: forming an anode on a substrate; sequentially forming a hole injection layer and a hole transport layer on the anode; evaporating, by a mask, an organic light emitting material to a particular position on a side of the hole transport layer away from the hole injection layer to form a light emitting layer having a plurality of light emitting region sets, wherein each of the plurality of light emitting region sets is configured to include at least two light emitting regions, and there is a separation region between two adjacent light emitting regions; sequentially forming, on the light emitting layer, an electron transport layer, which covers the light emitting layer, and an electron injection layer; and forming a cathode on a side of the electron injection layer away from the electron transport layer.

DETAILED DESCRIPTION

In order that the objects, advantages, and features of the present disclosure become more apparent and are more readily appreciated, a further description of the present disclosure will be made as below with reference to embodiments of the present disclosure taken in conjunction with the accompanying drawings.

Figure 1:
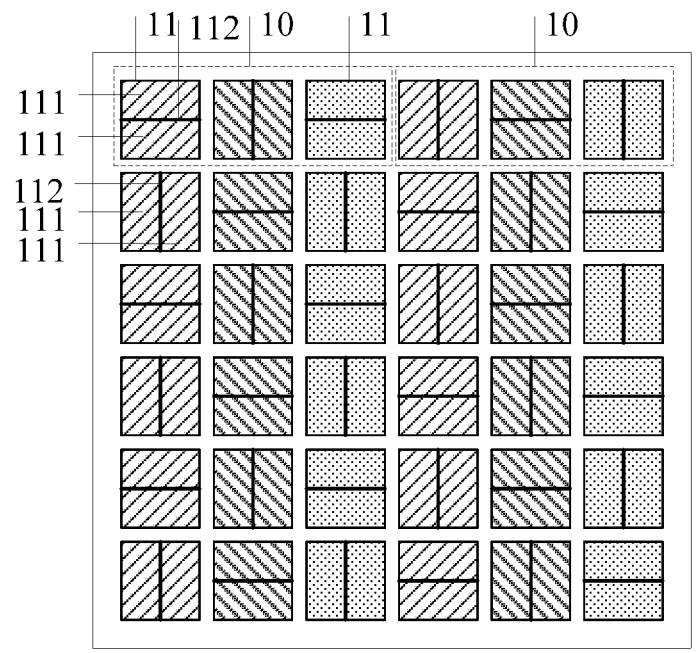
FIG. 1 is a schematic view showing a configuration of a first type of pixel structure according to an embodiment of the present disclosure, in which each sub-pixel is divided into two target sub-pixels by one separation region.
Figure 2:
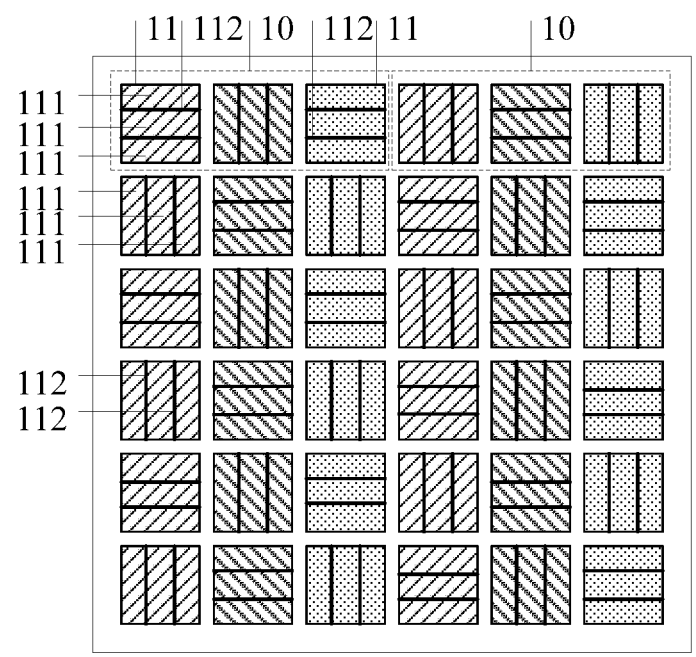
FIG. 2 is a schematic view showing a configuration of a second type of pixel structure according to an embodiment of the present disclosure, in which each sub-pixel is divided into three target sub-pixels by two separation regions.
Figure 3:
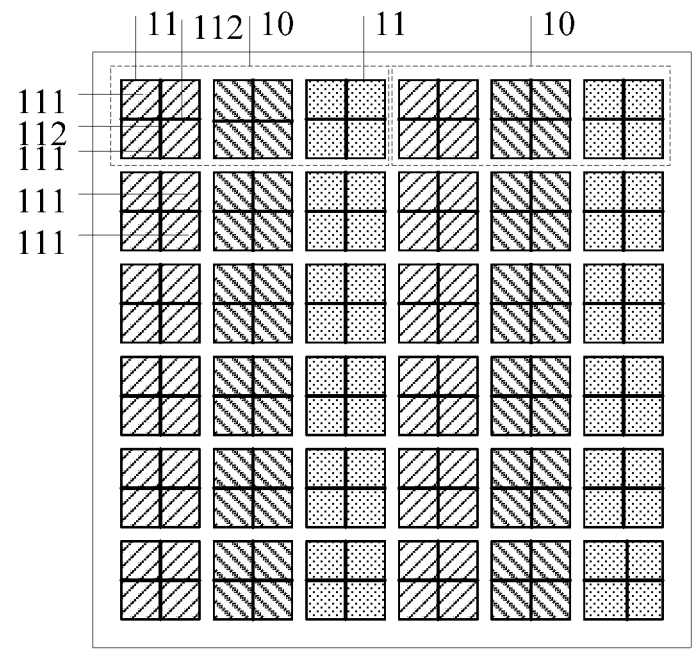
FIG. 3 is a schematic view showing a configuration of a third type of pixel structure according to an embodiment of the present disclosure, in which each sub-pixel is divided into four target sub-pixels by two separation regions.
Figure 4:
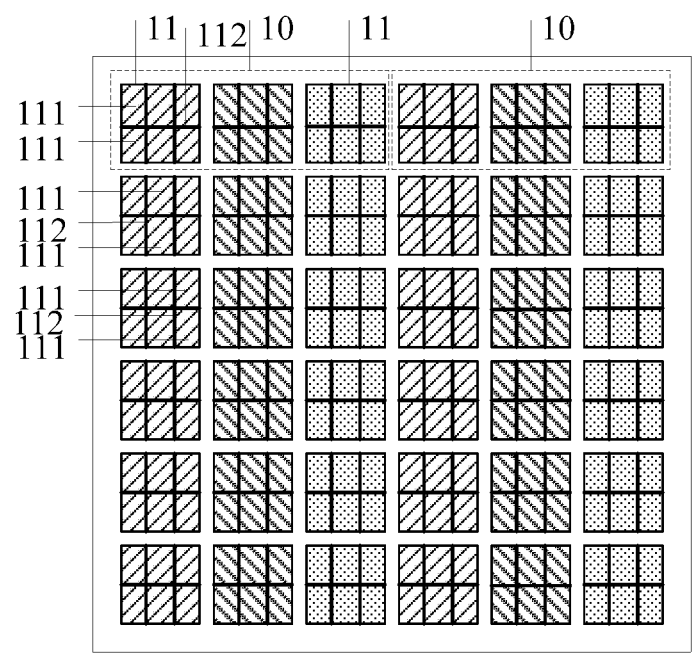
FIG. 4 is a schematic view showing a configuration of a fourth type of pixel structure according to an embodiment of the present disclosure, in which each sub-pixel is divided into six target sub-pixels by three separation regions.

Referring to FIG. 1, a schematic view of a configuration of a first type of pixel structure according to an embodiment of the present disclosure is shown, FIG. 2 is a schematic view showing a configuration of a second type of pixel structure according to an embodiment of the present disclosure, FIG. 3 is a schematic view showing a configuration of a third type of pixel structure according to an embodiment of the present disclosure, and FIG. 4 is a schematic view showing a configuration of a fourth type of pixel structure according to an embodiment of the present disclosure.

Embodiments of the present disclosure provide a pixel structure. The pixel structure includes: a plurality of pixel units 10, each of the plurality of pixel units 10 includes a plurality of sub-pixels 11, each of the plurality of sub-pixels 11 is divided into at least two target sub-pixels 111, and a separation region 112 is provided between two adjacent target sub-pixels 111.

By dividing each sub-pixel 11 into at least two target sub-pixels 111 and providing the separation region 112 between the two adjacent target sub-pixels 111, when one target sub-pixel 111 in the sub-pixel 11 fails, the remaining target sub-pixel 111 in the sub-pixel 11 will not be affected and can still continue to be operated to emit light of a corresponding color, effectively avoiding the failure of the entire sub-pixel 11, and greatly improving the overall service life of the sub-pixel 11. As a result, the residual image of the OLED display apparatus can be effectively avoided.

It is to be noted that in FIGS. 1 to 4, each pixel unit 10 (shown inside dashed boxes in the figures) includes three sub-pixels, which are a red sub-pixel, a green sub-pixel, and a blue sub-pixel, respectively. A first column of sub-pixels 11 are all red sub-pixels, a second column of sub-pixels 11 are all green sub-pixels, a third column of sub-pixels 11 are all blue sub-pixels, and so on. Of course, it is also possible to set all of a first row of sub-pixels 11 as red sub-pixels, all of a second row of sub-pixels 11 as green sub-pixels, and all of a third row of sub-pixels 11 as blue sub-pixels. In addition, the number of the sub-pixels included by each pixel unit 10 is also not limited to three. For example, each pixel unit 10 includes four sub-pixels, which are a red sub-pixel, a green sub-pixel, a blue sub-pixel, and a white sub-pixel, respectively.

As shown in FIGS. 1 and 2, the plurality of sub-pixels 11 are arranged in an array, and the separation regions 112 each have a strip shape, and are arranged such that in any one row of sub-pixels, a separation region 112 disposed in one of two adjacent sub-pixels 11 is perpendicular to a separation region 112 disposed in the other of the two adjacent sub-pixels 11, and in any one column of sub-pixels, a separation region 112 disposed in one of two adjacent sub-pixels 11 is also perpendicular to a separation region 112 disposed in the other of the two adjacent sub-pixels 11.

The separation region 112 is in the shape of an elongated strip. The separation region 112 shown in FIGS. 1 to 4 is simplified into a thick black line segment.

Therefore, in FIGS. 1 and 2, in any one row of sub-pixels, a separation region 112 disposed in one of two adjacent sub-pixels 11 is perpendicular to a separation region 112 disposed in the other of the two adjacent sub-pixels 11, and in any one column of sub-pixels, a separation region 112 disposed in one of two adjacent sub-pixels 11 is perpendicular to a separation region 112 disposed in the other of the two adjacent sub-pixels 11. By setting the separation region 112 disposed in one of two adjacent sub-pixels 11 to be perpendicular to the separation region 112 disposed in the other of the two adjacent sub-pixels 11, the appearance of linear residual images in the row and column directions can be effectively avoided.

When at least two separation regions 112 are disposed in each of the plurality of sub-pixels 11, the separation regions 112 disposed in each of the plurality of sub-pixels 11 are arranged parallel to each other.

As shown in FIG. 2, two separation regions 112 are disposed in each of the plurality of sub-pixels 11, and the two separation regions 112 disposed in each of the plurality of sub-pixels 11 are arranged parallel to each other. Therefore, one sub-pixel 11 may be divided into three target sub-pixels 111. In an optional embodiment, three separation regions 112 are disposed in each of the plurality of sub-pixels 11, and the three separation regions 112 disposed in each of the plurality of sub-pixels 11 are arranged parallel to each other, and thus, one sub-pixel 11 may be divided into four target sub-pixels 111, and so on.

By disposing at least two separation regions 112 in each of the plurality of sub-pixels 11, and arranging the separation regions 112, disposed in each of the plurality of sub-pixels 11, to be parallel to each other, one sub-pixel 11 may be divided into at least three target sub-pixels 111, further increasing the number of the target sub-pixels 111. When one target sub-pixel 111 in the sub-pixel 11 fails, the remaining major target sub-pixels 111 can still continue to be operated, which can effectively avoid the failure of the entire sub-pixel 11, and greatly improve the overall service life of the sub-pixel 11.

As shown in FIG. 3, two separation regions 112 are also disposed in each of the plurality of sub-pixels 11, and the two separation regions 112 disposed in each of the plurality of sub-pixels 11 are arranged perpendicularly to each other.

It can be seen that the separation regions 112 disposed in each of the plurality of sub-pixels 11 are arranged perpendicular to each other, and one sub-pixel 11 is divided into four target sub-pixels 111.

In some optional embodiments, when at least three separation regions 112 are disposed in each of the plurality of sub-pixels 11, specified side edges of any two separation regions 112 disposed in each of the plurality of sub-pixels 11 are arranged parallel or perpendicular to each other.

As shown in FIG. 4, three separation regions 112 are disposed in each of the plurality of sub-pixels 11, one of the three separation regions 112 is arranged along the column direction, and the other two are arranged along the row direction. Therefore, it can be seen that any two separation regions 112 disposed in each of the plurality of sub-pixels 11 are perpendicular or parallel to each other, and one sub-pixel 11 is divided into six target sub-pixels 111. Of course, In some embodiments, when four separation regions 112 are disposed in each of the plurality of sub-pixels 11, two of the four separation regions 112 are arranged along the column direction, and the other two are arranged along the row direction, and thus, any two separation regions 112 disposed in each of the plurality of sub-pixels 11 are arranged perpendicular or parallel to each other, and one sub-pixel 11 may be divided into nine target sub-pixels 111, and so on.

In an optional embodiment of the present disclosure, any two target sub-pixels 111 have the same area. each sub-pixel 11 is equally divided into two target sub-pixels 111 as shown in FIG. 1, each sub-pixel 11 is equally divided into three target sub-pixels 111 as shown in FIG. 2, each sub-pixel 11 is equally divided into four target sub-pixels 111 as shown in FIG. 3, and each sub-pixel 11 is equally divided into six target sub-pixels as shown in FIG. 4.

If in one sub-pixel 11, the areas of any two target sub-pixels 111 are not equal, if the target sub-pixel 111 with a larger area fails, the other target sub-pixel 111 has a smaller area, and the brightness of light emitted by the target sub-pixel 111 with the smaller area is the brightness of light emitted by the entire sub-pixel 11, and the brightness of the light emitted by the entire sub-pixel 11 is usually much smaller than the required brightness, which affects the display effect of the OLED display apparatus. Therefore, by equally dividing one sub-pixel 11 into at least two target sub-pixels 111 having the same area, when one of the at least two target sub-pixel 111 fails, the other target sub-pixel 111 can provide at least half of the brightness, which can prevent the brightness of the light emitted by the sub-pixel 11 from being much smaller than the required brightness, and thus improve the display effect of the OLED display apparatus.

Specifically, the number of the target sub-pixels 111 into which each of the plurality of sub-pixels 11 is divided is in a range of 2 to 10, and a width of each of the at least two target sub-pixels 111 is greater than 10 μm.

It is to be noted that the width of each of the at least two target sub-pixels 111 refers to the smallest one of all of side lengths of each of the at least two target sub-pixel 111, and the sub-pixel 11 has a centrally symmetric shape, including any one of a square, a rectangle, a parallelogram, and a hexagon. When the sub-pixel 11 has a square shape as shown in FIG. 1, in FIG. 1, the width of each of the two target sub-pixels 111 in the first row and first column refers to the width along the column direction, and the width of each of the two target sub-pixels 111 in the first row and second column refers to the width in the row direction.

Figure 5:
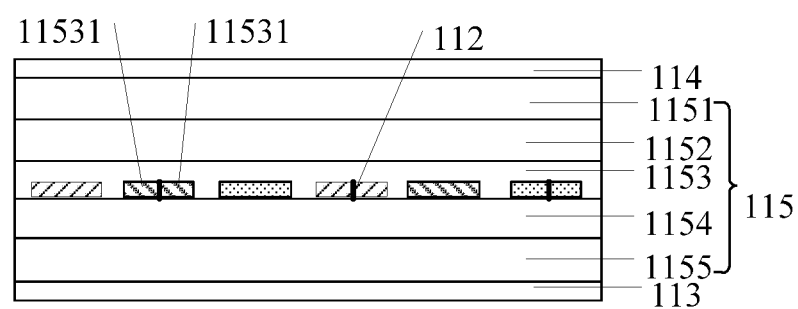
FIG. 5 is a sectional view showing the pixel structure shown in FIG. 1.

Referring to FIG. 5, a sectional view of the pixel structure shown in FIG. 1 is shown. Specifically, a sectional view of an odd-numbered row of sub-pixels taken along the row direction in FIG. 1 is shown.

Each of the plurality of sub-pixels 11 includes an anode 113, a cathode 114, and an organic functional layer 115 between the anode 113 and the cathode 114. The organic functional layer 115 includes an electron injection layer 1151, an electron transport layer 1152, a light emitting layer 1153, a hole transport layer 1154, and a hole injection layer 1155, which are sequentially disposed on a side of the cathode 114 close to the anode 113. The light emitting layer 1153 includes at least two light emitting regions 11531, and the separation region 112 is provided between two adjacent light emitting regions 11531.

In an actual manufacturing process, an anode 113 is formed on a substrate, and a hole injection layer 1155 and a hole transport layer 1154 are sequentially formed on the anode 113. Then, a mask is manufactured. One sub-pixel 11 corresponds to one mask pattern, and the mask pattern includes at least two aperture structures, and a partition is disposed between any two of the at least two aperture structures. An organic light emitting material is evaporated through each aperture structure to a particular position on a side of the hole transport layer 1154 away from the hole injection layer 1155 to form a light emitting layer 1153 including at least two light emitting regions 11531, and a separation region 112 is provided between two adjacent light emitting regions 11531. Then, an electron transport layer 1152, which covers the light emitting layer 1153, and an electron injection layer 1151 are formed. Finally, a cathode 114 is formed.

It is to be noted that no material is provided in the separation region 112, and the separation region is only a separating space region. By dividing the light emitting layer 1153 of each sub-pixel 11 into at least two light emitting regions 11531, and providing the separation region 112 between two adjacent light emitting regions 11531, each of the plurality of sub-pixels 11 is divided into at least two target sub-pixels 111, and the separation region 112 is provided between two adjacent target sub-pixels 111.

In the embodiments of the present disclosure, a plurality of pixel units is provided, each of the plurality of pixel units includes a plurality of sub-pixels, each of the plurality of sub-pixels is divided into at least two target sub-pixels, and a separation region is provided between two adjacent target sub-pixels. By dividing each sub-pixel into at least two target sub-pixels and providing the separation region between two adjacent target sub-pixels, when one target sub-pixel in the sub-pixel fails, the remaining target sub-pixel in the sub-pixel can still continue to be operated to emit light of a corresponding color. As a result, the residual image of the OLED display apparatus can be effectively avoided, the display performance of the OLED display apparatus can be improved and the user experience cannot be limited.

Embodiments of the present disclosure provide a display panel including the above pixel structure.

The display panel further includes a substrate, and a pixel driving circuit disposed on the substrate and connected to the anode 113 of the sub-pixel 11 of the pixel structure.

By driving the pixel driving circuit to apply a positive voltage to the anode 113 while applying a negative voltage to the cathode 114, holes are provided by the anode 113, and enter the light emitting layer 1153 through the hole injection layer 1155 and the hole transport layer 1154, and electrons are provided by the cathode 114, and enter the light emitting layer 1153 through the electron injection layer 1151 and the electron transport layer 1152. In the light emitting layer 1153, excitons are formed by the electrons and the holes and emit light of a particular color by de-excitation radiation.

Specifically, it is possible for one pixel driving circuit to drive one sub-pixel 11. In this case, the at least two target sub-pixels 111 in the sub-pixel 11 share the anode 113. It is also possible for one pixel driving circuit to drive one target sub-pixel 111. In this case, the at least two target sub-pixels 111 in the sub-pixel 11 do not share the anode 113.

The above description may be referred to for a specific description of the pixel structure and the pixel structure is no longer described for the sake of brevity.

Embodiments of the present disclosure further provide a display apparatus including the above display panel. The display apparatus is an OLED display apparatus.

In actual applications, the display apparatus may include any products or parts having a displaying function, such as a mobile phone, a tablet computer, a TV, a display, a notebook computer, and a navigator.

In the embodiments of the present disclosure, the display panel includes the pixel structure. a plurality of pixel units is provided, each of the plurality of pixel units includes a plurality of sub-pixels, each of the plurality of sub-pixels is divided into at least two target sub-pixels, and a separation region is provided between two adjacent target sub-pixels. By dividing each sub-pixel into at least two target sub-pixels and providing the separation region between two adjacent target sub-pixels, when one target sub-pixel in the sub-pixel fails, the remaining target sub-pixel in the sub-pixel can still continue to be operated to emit light of a corresponding color. As a result, the residual image of the OLED display apparatus can be effectively avoided, the display performance of the OLED display apparatus can be improved and the user experience cannot be limited.

Each embodiment of the description is described in a progressive manner. The contents mainly described in each embodiment are different from those mainly described in other embodiments. For contents that are not described in an embodiment, those described in another embodiment may be referred to.

Finally, it should also be noted that in the present disclosure, relational terms such as "first" and "second" are used only to distinguish an entity or operation from another entity or operation, and do not necessarily require or imply that there is any such actual relation or sequence between these entities or operations. Moreover, the terms "include", "comprise" or any other variant thereof are intended to cover non-exclusive inclusion, so that a process, method, commodity or equipment that includes a series of elements includes not only those elements, but also other elements that are not explicitly listed, or elements that are inherent to the process, method, commodity, or equipment. Unless defined otherwise, an element defined by an expression such as "includes a . . . ", "including a . . . " or "comprising a . . . " does not exclude that there are also other identical elements in a process, method, commodity, or equipment that includes the element.

The pixel structure, the display panel, and the display apparatus according to the present disclosure have been described in detail above. Specific examples have been used in the present disclosure to explain the principles and implementations of the present disclosure. The descriptions of the above embodiments are only used to fabricate understanding of the methods and core ideas of the present disclosure. At the same time, those skilled in the art can make any changes and modifications to the embodiments and application ranges according to the ideas of the present disclosure. In summary, the content of this specification should not be construed as limiting the present disclosure.

What is claimed is:

1. A pixel structure, characterized in that it comprises: a plurality of pixel units, wherein each of the plurality of pixel units comprises a plurality of sub-pixels, each of the plurality of sub-pixels is divided into at least two target sub-pixels, and a separation region is provided between two adjacent target sub-pixels, wherein
   the plurality of sub-pixels are arranged in an array, and the separation regions each have a strip shape, and are arranged such that in any one row of sub-pixels, each separation region disposed in one of two adjacent sub-pixels is perpendicular to each separation region disposed in the other of the two adjacent sub-pixels, and in any one column of sub-pixels, each separation region disposed in one of two adjacent sub-pixels is also perpendicular to each separation region disposed in the other of the two adjacent sub-pixels.

2. The pixel structure of claim 1, characterized in that any two target sub-pixels have a same area.

3. The pixel structure of claim 1, characterized in that a number of the target sub-pixels into which the each of the plurality of sub-pixels is divided is in a range of 2 to 10.

4. The pixel structure of claim 1, characterized in that at least two separation regions are disposed in the each of the plurality of sub-pixels, and the at least two separation regions disposed in the each of the plurality of sub-pixels are arranged parallel to each other.

5. The pixel structure of claim 1, characterized in that a smallest side length of each of the at least two target sub-pixels is greater than 10 µm.

6. The pixel structure of claim 1, characterized in that the each of the plurality of sub-pixels comprises an anode, a cathode, and an organic functional layer between the anode and the cathode, the organic functional layer comprises an electron injection layer, an electron transport layer, a light emitting layer, a hole transport layer, and a hole injection layer, which are sequentially disposed on a side of the cathode close to the anode, wherein the light emitting layer comprises a plurality of light emitting region sets, each of the plurality of light emitting region sets comprises at least two light emitting regions, and the separation region is provided between two adjacent light emitting regions.

7. The pixel structure of claim 6, characterized in that the plurality of light emitting region sets are arranged in an array, and the separation regions each have a strip shape, and are arranged such that in any one row of light emitting region sets, a separation region disposed in one of two adjacent light emitting region sets is perpendicular to a separation region disposed in the other of the two adjacent light emitting region sets, and in any one column of light emitting region sets, a separation region disposed in one of two adjacent light emitting region sets is also perpendicular to a separation region disposed in the other of the two adjacent light emitting region sets.

8. The pixel structure of claim 7, characterized in that at least two separation regions are disposed in the each of the plurality of light emitting region sets, and the at least two separation regions disposed in the each of the plurality of light emitting region sets are arranged parallel to each other.

9. The pixel structure of claim 6, characterized in that the separation regions each have a strip shape, and in a case where two separation regions are disposed in the each of the plurality of light emitting region sets, the separation regions are arranged such that the two separation regions disposed in the each of the plurality of light emitting region sets are perpendicular to each other, and in a case where at least three separation regions are disposed in the each of the plurality of sub-pixels, the separation regions are arranged such that any two of the at least three separation regions disposed in the each of the plurality of light emitting region sets are parallel or perpendicular to each other.

10. A display panel, characterized in that it comprises the pixel structure of claim 1.

11. A display apparatus, characterized in that it comprises the display panel of claim 10.

12. A method of manufacturing a pixel structure, characterized in that it comprises steps of:

forming an anode on a substrate;

sequentially forming a hole injection layer and a hole transport layer on the anode;

evaporating, by a mask, an organic light emitting material to a particular position on a side of the hole transport layer away from the hole injection layer to form a light emitting layer having a plurality of light emitting region sets, wherein each of the plurality of light emitting region sets is configured to comprise at least two light emitting regions, and there is a separation region between two adjacent light emitting regions;

sequentially forming, on the light emitting layer, an electron transport layer which covers the light emitting layer, and an electron injection layer; and forming a cathode on a side of the electron injection layer away from the electron transport layer, wherein the plurality of sub-pixels are arranged in an array, and the separation regions each have a strip shape, and are arranged such that in any one row of sub-pixels, each separation region disposed in one of two adjacent sub-pixels is perpendicular to each separation region disposed in the other of the two adjacent sub-pixels, and in any one column of sub-pixels, each separation region disposed in one of two adjacent sub-pixels is also perpendicular to each separation region disposed in the other of the two adjacent sub-pixels.

* * * * *